(12) United States Patent
Yamane et al.

(10) Patent No.: US 10,672,420 B2
(45) Date of Patent: Jun. 2, 2020

(54) STORAGE DEVICE, STORAGE APPARATUS, MAGNETIC HEAD, AND ELECTRONIC APPARATUS

(71) Applicant: SONY CORPORATION, Tokyo (JP)

(72) Inventors: Kazutaka Yamane, Kanagawa (JP);
Hiroyuki Uchida, Kanagawa (JP);
Yutaka Higo, Kanagawa (JP);
Hiroyuki Ohmori, Kanagawa (JP);
Kazuhiro Bessho, Kanagawa (JP);
Masanori Hosomi, Tokyo (JP)

(73) Assignee: Sony Corporation, Tokyo (JP)

( * ) Notice: Subject to any disclaimer, the term of this patent is extended or adjusted under 35 U.S.C. 154(b) by 10 days.

(21) Appl. No.: 15/553,848

(22) PCT Filed: Jan. 18, 2016

(86) PCT No.: PCT/JP2016/000229
§ 371 (c)(1),
(2) Date: Aug. 25, 2017

(87) PCT Pub. No.: WO2016/139878
PCT Pub. Date: Sep. 9, 2016

(65) Prior Publication Data
US 2018/0053521 A1    Feb. 22, 2018

(30) Foreign Application Priority Data
Mar. 5, 2015 (JP) .................. 2015-044064

(51) Int. Cl.
*G11C 11/15* (2006.01)
*G11B 5/39* (2006.01)
(Continued)

(52) U.S. Cl.
CPC .......... *G11B 5/3909* (2013.01); *G11B 5/3912* (2013.01); *G11B 5/3967* (2013.01);
(Continued)

(58) Field of Classification Search
CPC ... G11B 5/3909; G11B 5/3912; G11B 5/3967; G11C 11/15; G11C 11/161; H01F 10/32;
(Continued)

(56) References Cited

U.S. PATENT DOCUMENTS

| 6,256,223 | B1 | 7/2001 | Sun |
| 2005/0184839 | A1 | 8/2005 | Nguyen et al. |
| 2012/0063220 | A1* | 3/2012 | Higo .................. G11C 11/16 365/173 |

FOREIGN PATENT DOCUMENTS

| JP | 2003-017782 A | 1/2003 |
| JP | 2005-109470 A | 4/2005 |

(Continued)

OTHER PUBLICATIONS

L. Berger, "Emission of Spin Waves by a Magnetic Multilayer Traversed by a Current", Department of Physics, Carnegie-Mellon University, Pittsburgh, Pennsylvania 15213-3890, Physical Review B, vol. 54, No. 13, Oct. 1, 1996, 6 pages.

(Continued)

*Primary Examiner* — Timor Karimy
(74) *Attorney, Agent, or Firm* — K&L Gates LLP

(57) ABSTRACT

The present technology relates to a storage device that realizes both a high information retention property and a low power consumption. A storage device includes a fixed layer, a storage layer, an intermediate layer, and a heat generation layer. The fixed layer includes a first ferromagnetic layer that includes a fixed perpendicular magnetization. The storage layer includes a second ferromagnetic layer that includes a perpendicular magnetization invertible by a spin injection. The intermediate layer is formed of an insulator and is arranged between the storage layer and the fixed layer. The heat generation layer is formed of a resistance heating element and is arranged in at least one of the storage layer and the fixed layer. With this configuration, it becomes (Continued)

possible to provide a storage device that realizes both a high information retention property and a low power consumption.

17 Claims, 11 Drawing Sheets

(51) Int. Cl.
| | |
|---|---|
| H01L 43/08 | (2006.01) |
| H01L 43/10 | (2006.01) |
| H01L 27/22 | (2006.01) |
| H01F 10/30 | (2006.01) |
| G11C 11/16 | (2006.01) |
| H01L 27/105 | (2006.01) |
| H01L 29/82 | (2006.01) |
| H01F 10/32 | (2006.01) |

(52) U.S. Cl.
CPC ............ *G11C 11/15* (2013.01); *G11C 11/161* (2013.01); *G11C 11/1675* (2013.01); *H01F 10/30* (2013.01); *H01F 10/329* (2013.01); *H01F 10/3286* (2013.01); *H01L 27/105* (2013.01); *H01L 27/228* (2013.01); *H01L 29/82* (2013.01); *H01L 43/08* (2013.01); *H01L 43/10* (2013.01); *H01F 10/3254* (2013.01); *H01F 10/3272* (2013.01)

(58) Field of Classification Search
CPC ............... H01F 10/3254; H01F 10/329; H01F 10/3272; H01F 10/3286; H01L 27/105; H01L 27/228; H01L 29/82; H01L 43/08; H01L 43/10
See application file for complete search history.

(56) References Cited

FOREIGN PATENT DOCUMENTS

| | | |
|---|---|---|
| JP | 2008-227388 A | 9/2008 |
| JP | 2008-235533 A | 10/2008 |
| JP | 2010-140973 A | 6/2010 |
| JP | 2013-115413 A | 6/2013 |
| WO | 2011/033873 A | 3/2011 |
| WO | 2011/033873 A1 | 3/2011 |

OTHER PUBLICATIONS

J.C. Slonczewski, "Current-driven Excitation of Magnetic Multilayers", Journal of Magnetism and Magnetic Materials 159 (1996) L1-L7, Elsevier, 1996, 7 pages.

Albert, et al., "Spin-polarized Current Switching of a Co Thin Film Nanomagnet", Applies Physics Letters, vol. 77, No. 23, Dec. 4, 2000, pp. 3809-3811.

Mangin, et al., "Current-induced Magnetization Reversal in Nanopillars with Perpendicular Anisotropy", Nature Publishing Group, vol. 5, Mar. 2006, pp. 210-215.

L. Berger, "Emission of Spin Waves By a Magnetic Multilayer Traversed By a Current", 1996 The American Physical Society, vol. 54, No. 13, 1996, 9353-9358 pages.

J.C. Slonczewski, "Current-driven Excitation of Magnetic Multilayers", Journal of Magnetism and Magnetic Materials 159 (1996) L1-L7, 1996, 7 pages.

Albert, et al., "Spin-polarized Current Switching of a Co thin Film Nanomagnet", 2000 American Institute of Physics, Applied Physics Letters, vol. 77, No. 23, Dec. 4, 2000, 3809-3811 pages.

Mangin, et al., "Current-Induced Magnetization Reversal in Nanopillars with Perpendicular Anisotropy", 2006 Nature Publishing Group, vol. 5, Mar. 2006, 210-215 pages.

International Search Report and Written Opinion of PCT Application No. PCT/JP2016/000229, dated Mar. 15, 2016, 2 pages of English Translation and 8 pages of ISRWO.

\* cited by examiner

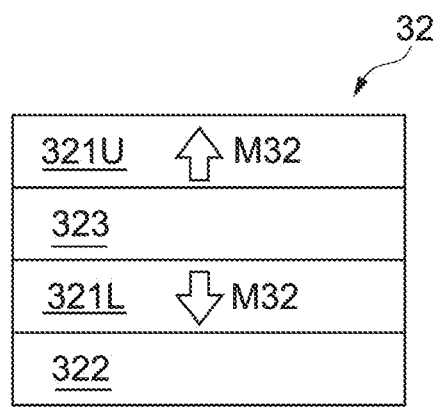
FIG. 6(A)
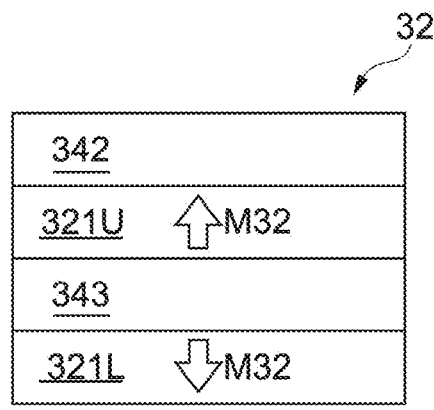
FIG. 6(B)
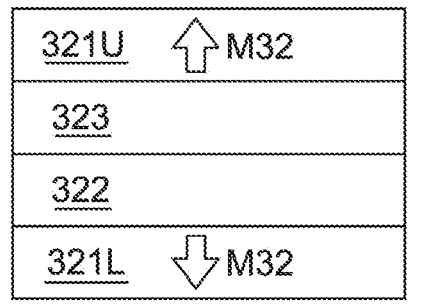
FIG. 6(C)
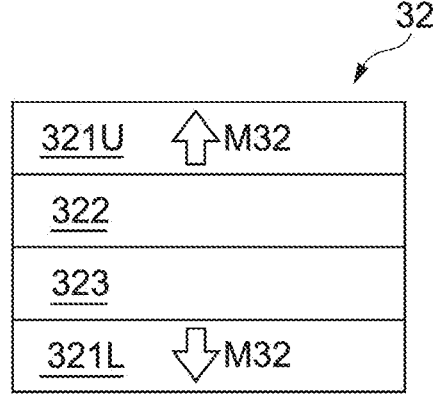
FIG. 6(D)
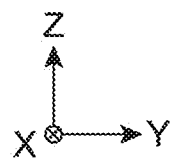

STORAGE DEVICE, STORAGE APPARATUS, MAGNETIC HEAD, AND ELECTRONIC APPARATUS

CROSS REFERENCE TO RELATED APPLICATIONS

This application is a U.S. National Phase of International Patent Application No. PCT/JP2016/000229 filed on Jan. 18, 2016, which claims priority benefit of Japanese Patent Application No. JP 2015-044064 filed in the Japan Patent Office on Mar. 5, 2015. Each of the above-referenced applications is hereby incorporated herein by reference in its entirety.

TECHNICAL FIELD

The present technology relates to a storage device, a storage apparatus, a magnetic head, and an electronic apparatus that perform recording using a spin torque magnetization inversion.

BACKGROUND ART

In various electronic apparatuses such as a computer, a DRAM (Dynamic Random Access Memory) that can be operated at high speed and is capable of recording information with a high density is widely used as a storage apparatus. However, in recent years, a nonvolatile memory that retains recorded information even when power is turned off is starting to be used in various fields in place of the DRAM which is a volatile memory in which recorded information is deleted when power is turned off.

An MRAM (Magnetoresistive Random Access Memory) is known as the nonvolatile memory capable of recording at high speed. As the MRAM, a configuration that uses a giant magneto resistive (GMR: Giant Magneto Resistive) device and a configuration that uses a magnetic tunnel junction (MTJ: Magnetic Tunnel Junction) device are known.

The MRAM that uses the MTJ device is called STT (Spin Transfer Torque)-MRAM. Since the STT-MRAM includes a higher magnetoresistance change rate (MR ratio) than the MRAM that uses a GMR device, high-intensity readout signals can be generated. Technologies related to the STT-MRAM are disclosed in, for example, Patent Literatures 1 to 4 and Non-patent Literatures 1 to 4.

As an STT-MRAM recording system, there are an in-plane magnetization system and a perpendicular magnetization system in which magnetization directions mutually differ between MTJ devices. In recent years, an STT-MRAM of a perpendicular magnetization system, that can be made more compact and set to have a large capacity is attracting attention. In a recording operation of the STT-MRAM of a perpendicular magnetization system, by performing a spin injection by causing a current to flow through each MTJ device, a perpendicular magnetization of a storage layer in each of the MTJ devices is inverted. In the STT-MRAM, binary information (typically, "0" and "1") can be recorded on the basis of directions of the perpendicular magnetizations in the MTJ devices.

CITATION LIST

Patent Literature

Patent Literature 1: Japanese Patent Application Laid-open No. 2003-17782

Patent Literature 2: Specification of U.S. Pat. No. 6,256,223
Patent Literature 3: Specification of US Patent Application Publication No. 2005/0184839A1
Patent Literature 4: Japanese Patent Application Laid-open No. 2008-227388

Non-Patent Literature

Non-Patent Literature 1: PHYs. Rev. B, 54.9353 (1996)
Non-Patent Literature 2: J. Magn. Mat., 159, L1 (1996)
Non-Patent Literature 3: F. J. Albert et al., Appl. Phy. Lett., 77, 3809 (2000)
Non-Patent Literature 4: Nature Materials., 5, 210 (2006)

DISCLOSURE OF INVENTION

Technical Problem

In the STT-MRAM of a perpendicular magnetization system, a higher information retention property with which recorded information can be retained more stably can be obtained as a stability of the perpendicular magnetization in the MTJ devices becomes higher. Meanwhile, since the perpendicular magnetization becomes more difficult to be inverted as the stability of the perpendicular magnetization in the MTJ devices becomes higher, a large current becomes necessary for inverting the perpendicular magnetization during a recording operation. In this way, in the STT-MRAM, the information retention property and power consumption are in a mutual tradeoff relationship, and a technique for realizing them both is being desired.

In view of the circumstances as described above, the present technology aims at providing a storage device, a storage apparatus, a magnetic head, and an electronic apparatus that realize both a high information retention property and low power consumption.

Solution to Problem

For attaining the object described above, a storage device according to an embodiment of the present technology includes a fixed layer, a storage layer, an intermediate layer, and a heat generation layer.

The fixed layer includes a first ferromagnetic layer that includes a fixed perpendicular magnetization.

The storage layer includes a second ferromagnetic layer that includes a perpendicular magnetization invertible by a spin injection.

The intermediate layer is formed of an insulator and is arranged between the storage layer and the fixed layer.

The heat generation layer is formed of a resistance heating element and is arranged in at least one of the storage layer and the fixed layer.

In the storage device having this configuration, a current flows through the heat generation layer formed of a resistance heating element due to a spin injection during a recording operation, and Joule heat is thus generated, so a temperature of the second ferromagnetic layer of the storage layer increases. Therefore, by the temperature of the second ferromagnetic layer rising only at an instant of the recording operation, the stability of the perpendicular magnetization of the second ferromagnetic layer is lowered, and it becomes easier for the perpendicular magnetization of the second ferromagnetic layer to be inverted. Accordingly, recording operations of low power consumption become possible in the storage device.

On the other hand, in the storage device, the second ferromagnetic layer of the storage layer returns to an ambient temperature (typically, room temperature) after the recording operation, and the stability of the perpendicular magnetization of the second ferromagnetic layer returns to the high state. In other words, while the stability of the perpendicular magnetization of the second ferromagnetic layer is lowered for a moment during the recording operation, the stability is maintained high at other times. Therefore, a high information retention property is obtained in the storage device.

In this way, in the storage device, both the high information retention property and low power consumption can be realized.

Further, the storage device is insusceptible to a heat load applied thereto in a production process of a storage apparatus including the storage device or a process of mounting the storage apparatus onto various electronic apparatuses. Specifically, in the storage device, an influence of a heat load on the perpendicular magnetization of the first ferromagnetic layer of the fixed layer and the perpendicular magnetization of the second ferromagnetic layer of the storage layer is suppressed by heat resistance of the heat generation layer formed of a resistance heating element. Therefore, since a perpendicular magnetic anisotropy of the first ferromagnetic layer and the second ferromagnetic layer is difficult to be impaired in the storage device, high recording performance is secured.

The heat generation layer may be arranged in at least the storage layer.

In the storage device including this configuration, since the heat generation layer is arranged close to the second ferromagnetic layer, the temperature of the second ferromagnetic layer is apt to increase during the recording operation. Accordingly, recording operations of lower power consumption become possible.

The heat generation layer may be adjacent to the first ferromagnetic layer or the second ferromagnetic layer.

In the storage device including this configuration, the influence of a heat load on the perpendicular magnetizations of the first ferromagnetic layer and the second ferromagnetic layer is effectively suppressed by the heat resistance of the heat generation layer adjacent to the first ferromagnetic layer and the second ferromagnetic layer. Moreover, in a case where the heat generation layer is adjacent to the second ferromagnetic layer, the temperature of the second ferromagnetic layer becomes more apt to increase during the recording operation, so recording operations of lower power consumption become possible.

The resistance heating element may be configured by at least one of a nitride, carbide, boride, oxide, elemental carbon, and elemental boron and include an electrical resistivity of 1 $\Omega$m or more and $1*10^4$ $\Omega$m or less at 20° C.

The heat generation layer may have a thickness of 0.2 nm or more and 2.0 nm or less.

In the heat generation layer formed of such a resistance heating element, Joule heat can be generated more effectively, and an effect of maintaining the perpendicular magnetic anisotropy of the first ferromagnetic layer and the second ferromagnetic layer can be obtained more favorably.

The first ferromagnetic layer and the second ferromagnetic layer may be formed of a metal including at least one of Co, Fe, and Ni as a main component or a boron alloy including at least one of Co, Fe, and Ni and B.

The first ferromagnetic layer and the second ferromagnetic layer may be formed of a material including at least one of V, Cr, Nb, Mo, Ta, W, Hf, Zr, Ti, and Ru as an accessory component.

In the storage device including this configuration, it becomes possible to form a favorable perpendicular magnetization in the first ferromagnetic layer of the fixed layer and the second ferromagnetic layer of the storage layer, and high recording performance can thus be obtained.

The fixed layer may further include two first ferromagnetic layers and a nonmagnetic layer arranged between the two first ferromagnetic layers.

At least one of the two first ferromagnetic layers may be formed of a material including at least one of Co, Fe, and Ni and at least one of Pt, Pd, Rh, and Ni as main components.

One of the two first ferromagnetic layers may be formed of a material including at least one of Co, Fe, and Ni and at least one of Pt, Pd, Rh, and Ni as main components, and the other one of the two first ferromagnetic layers may be formed of a metal including at least one of Co, Fe, and Ni as a main component or a boron alloy including at least one of Co, Fe, and Ni and B.

In the storage device including this configuration, by configuring the fixed layer in a so-called laminated ferrimagnetic structure, a leak field in the fixed layer can be suppressed, so it becomes possible to prevent the storage layer from being influenced by the leak field.

The insulator may be configured by MgO.

Since a magnetoresistance change rate (MR ratio) increases in the storage device including this configuration, recording operations of low power consumption becomes possible.

The storage device may further include a cap layer adjacent to the storage layer on a side opposite to the intermediate layer.

The cap layer may include a metal layer including any one of Hf, Ta, W, Zr, Nb, Mo, Ti, Mg, V, Cr, Ru, Rh, Pd, and Pt as a main component.

The cap layer may further include an oxide layer including any one of MgO, $Al_2O_3$, and $SiO_2$ as a main component.

In the storage device including this configuration, by covering the storage layer by the cap layer, an oxidization of the storage layer can be prevented from occurring.

The storage device may further include a base layer adjacent to the fixed layer on a side opposite to the intermediate layer.

The base layer may include a plurality of layers that include any one of Ta, Ti, Cu, TiN, TaN, NiCr, NiFeCr, Ru, and Pt as a main component.

In the storage device including this configuration, it becomes possible to control crystallization of the fixed layer adjacent to the base layer as well as causing the base layer to function as an electrode.

A storage apparatus according to an embodiment of the present technology includes a plurality of storage devices and a wiring unit configured to be capable of supplying a current to each of the plurality of storage devices.

The plurality of storage devices include a fixed layer, a storage layer, an intermediate layer, and a heat generation layer.

The fixed layer includes a first ferromagnetic layer that includes a fixed perpendicular magnetization.

The storage layer includes a second ferromagnetic layer that includes a perpendicular magnetization invertible by a spin injection.

The intermediate layer is formed of an insulator and is arranged between the storage layer and the fixed layer.

The heat generation layer is formed of a resistance heating element and is arranged in at least one of the storage layer and the fixed layer.

A magnetic head according to an embodiment of the present technology includes a magnetic device including a fixed layer, a storage layer, an intermediate layer, and a heat generation layer.

The fixed layer includes a first ferromagnetic layer that includes a fixed perpendicular magnetization.

The storage layer includes a second ferromagnetic layer that includes a perpendicular magnetization invertible by a spin injection.

The intermediate layer is formed of an insulator and is arranged between the storage layer and the fixed layer.

The heat generation layer is formed of a resistance heating element and is arranged in at least one of the storage layer and the fixed layer.

An electronic apparatus according to an embodiment of the present technology includes a storage unit including a plurality of storage devices and a control unit configured to be capable of accessing the storage unit.

The plurality of storage devices include a fixed layer, a storage layer, an intermediate layer, and a heat generation layer.

The fixed layer includes a first ferromagnetic layer that includes a fixed perpendicular magnetization.

The storage layer includes a second ferromagnetic layer that includes a perpendicular magnetization invertible by a spin injection.

The intermediate layer is formed of an insulator and is arranged between the storage layer and the fixed layer.

The heat generation layer is formed of a resistance heating element and is arranged in at least one of the storage layer and the fixed layer.

Advantageous Effects of Invention

As described above, according to the present technology, a storage device, a storage apparatus, a magnetic head, and an electronic apparatus that realize both a high information retention property and low power consumption can be provided.

It should be noted that the effects described herein are not necessarily limited, and any effect described in the present disclosure may be obtained.

BRIEF DESCRIPTION OF DRAWINGS

FIGS. 6(A), 6(B), 6(C), and 6(D) Cross-sectional diagrams each schematically showing a modified example of a fixed layer of the storage device.

MODES FOR CARRYING OUT THE INVENTION

Figure 1:
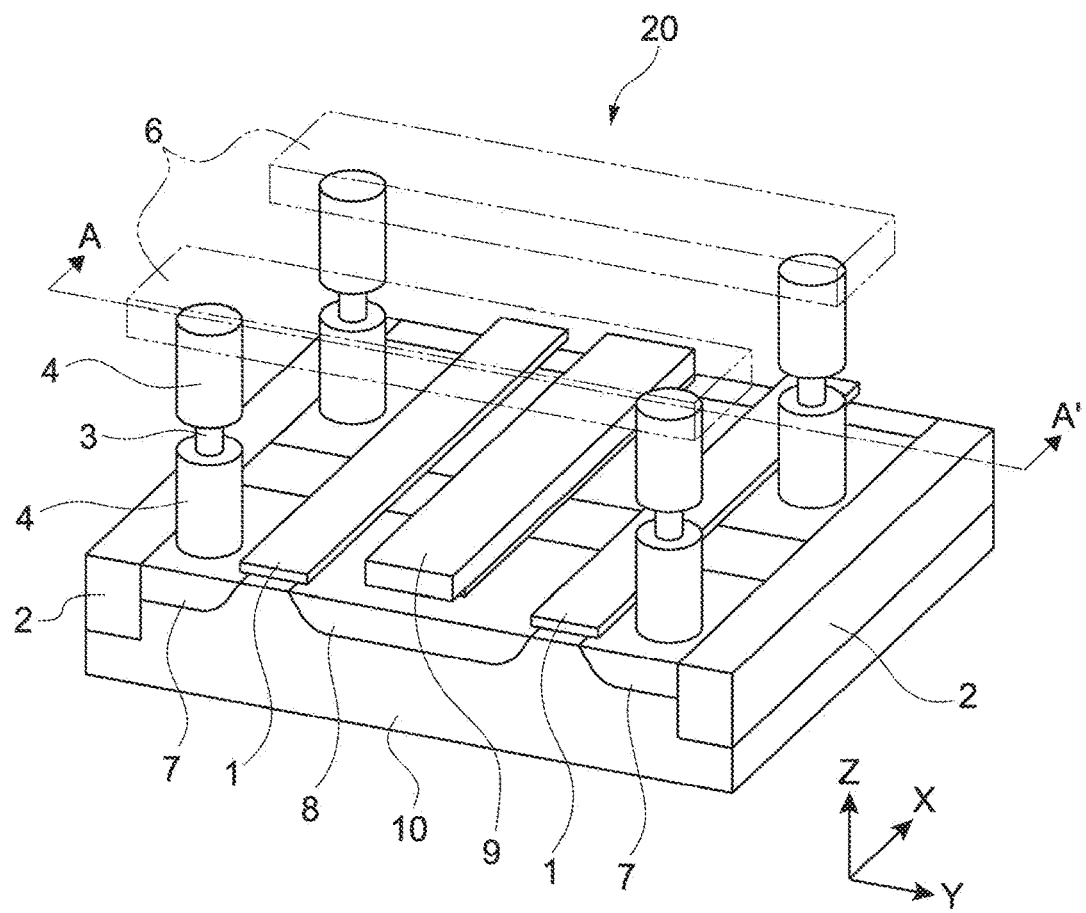
FIG. 1 A perspective view schematically showing a storage apparatus according to an embodiment of the present technology.

Hereinafter, an embodiment of the present technology will be described with reference to the drawings.

In the drawings, an X axis, a Y axis, and a Z axis orthogonal to one another are illustrated as appropriate. The X axis, the Y axis, and the Z axis are common throughout all the figures.

[Schematic Configuration of Storage Apparatus]

Figure 2:
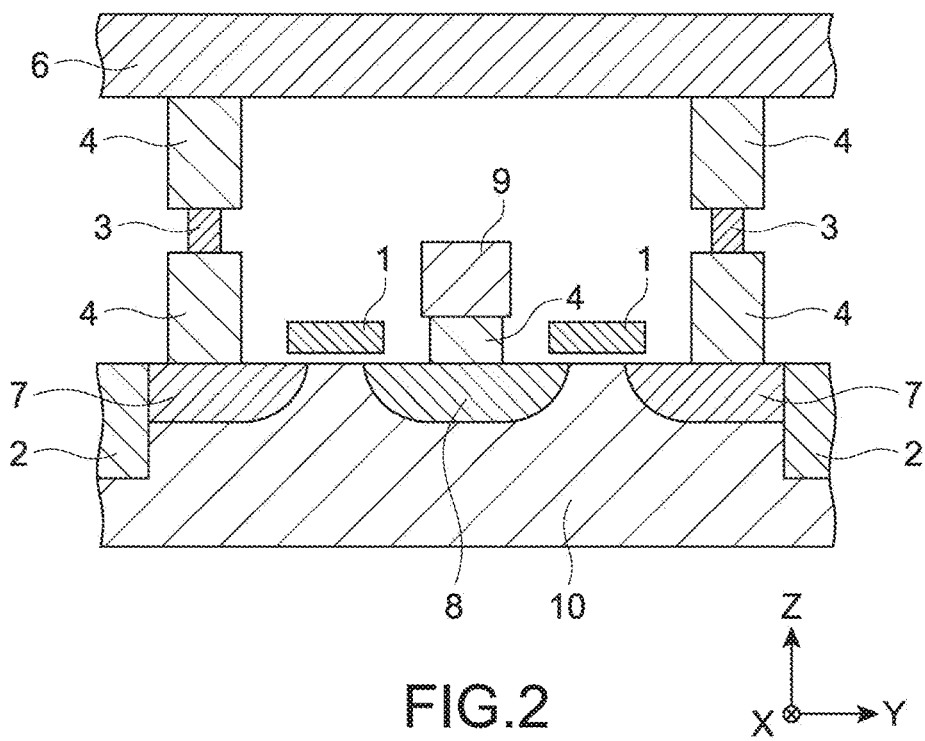
FIG. 2 A cross-sectional diagram of the storage apparatus taken along the line A-A' of FIG. 1.

FIG. 1 is a perspective view showing a schematic configuration of a storage apparatus 20 according to an embodiment of the present technology. FIG. 2 is a cross-sectional diagram of the storage apparatus 20 taken along the line A-A' of FIG. 1.

The storage apparatus 20 includes gate lines 1 as word lines extending in an X-axis direction, bit lines 6 extending in a Y-axis direction, and storage devices 3. The gate lines 1 and the bit lines 6 configure two types of address lines (wiring unit) orthogonal to one another. The bit lines 6 are provided above the gate lines 1 in a Z-axis direction.

The storage devices 3 are each arranged between the gate lines 1 and the bit lines 6 in correspondence with intersections of the gate lines 1 and the bit lines 6. The storage devices 3 configure an STT-MRAM (Spin Transfer Torque based Magnetic Random Access Memory) of a perpendicular magnetization system, that is capable of retaining information by directions of perpendicular magnetizations.

The storage apparatus 20 includes a semiconductor substrate 10 that holds the gate lines 1. Device separation areas 2, source areas 7, and a drain area 8 are provided in the semiconductor substrate 10. The device separation areas 2 demarcate memory cells in the storage apparatus 20. The source areas 7 and the drain area 8 configure a selection transistor for selecting each of the storage devices 3 together with the gate lines 1. Further, a wiring 9 that extends in the X-axis direction above the drain area 8 is provided on the semiconductor substrate 10.

A plurality of columnar contacts 4 that extend in the Z-axis direction are provided in the storage apparatus 20. The contacts 4 are formed of a conductive material such as copper, for example. The storage devices 3 are connected to the source areas 7 of the semiconductor substrate 10 via the contacts 4 and connected to the bit lines 6 via the contacts 4. The wiring 9 is connected to the drain area 8 via the contacts 4.

In a recording operation of the storage apparatus 20, a perpendicular magnetization of the storage devices 3 is inverted by a spin injection with respect to the storage devices 3. The spin injection with respect to the storage devices 3 is performed by causing a current to flow through the storage devices 3 by applying a voltage between the gate lines 1 and the bit lines 6. In the storage apparatus 20, a voltage can be applied between arbitrary gate lines 1 and bit lines 6 by the selection transistor described above, and a spin injection can be performed with respect to arbitrary storage devices 3 in accordance with combinations of the gate lines 1 and the bit lines 6.

It should be noted that since the selection transistor is operable with a current equal to or smaller than a saturation current, there is a need to perform the spin injection with a current equal to or smaller than the saturation current of the selection transistor in the recording operation of the storage apparatus 20. However, although details will be given later, in the storage apparatus 20 of this embodiment, the storage devices 3 are configured to be capable of at least performing a spin injection with a current smaller than the saturation current with respect to the selection transistor.

[Storage Device]

(Schematic Configuration)

Figure 3:
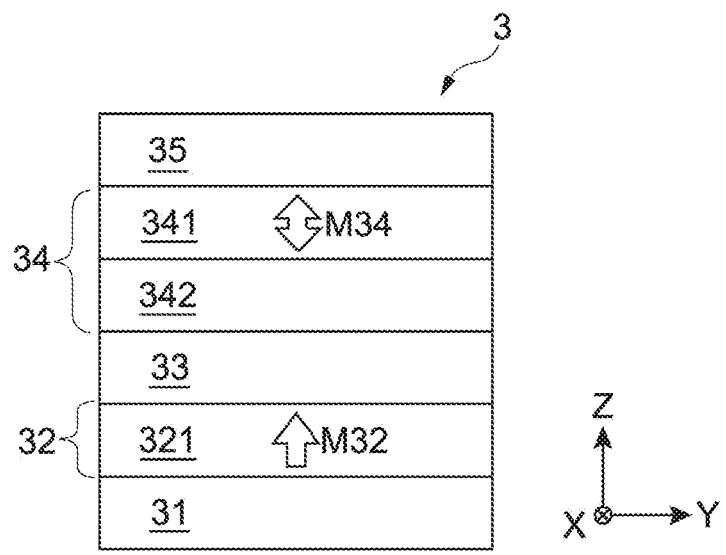
FIG. 3 A cross-sectional diagram schematically showing a storage device of the storage apparatus.

FIG. 3 is a cross-sectional diagram schematically showing the storage device 3 of the storage apparatus 20. The storage device 3 includes a base layer 31, a fixed layer 32, an intermediate layer 33, a storage layer 34, and a cap layer 35. Each layer of the storage device 3 is formed in a form of a film that extends parallel to an XY plane.

In the storage device 3, the fixed layer 32, the intermediate layer 33, and the storage layer 34 configure a magnetic tunnel junction (MTJ: Magnetic Tunnel Junction) device. It should be noted that the MTJ device is also called TMR (Tunnel Magneto Resistance) device.

In the storage device 3, it is possible to realize low power consumption and a large capacity by decreasing a dimension of the XY plane in the in-plane direction. From this viewpoint, it is favorable to make an area of a cross section parallel to the XY plane of the storage device 3 to be 0.01 $\mu m^2$ or less.

In a production process of the storage apparatus 20, the base layer 31, fixed layer 32, intermediate layer 33, storage layer 34, and cap layer 35 of the storage device 3 can be formed by a series of processes within a vacuum apparatus, and the storage device 3 can be patterned by a processing process such as etching after that. Therefore, the storage apparatus 20 including the storage devices 3 has an advantage that it can be produced by a general semiconductor MOS forming process.

(Fixed Layer)

The fixed layer (also called "reference layer", "pin layer", etc.) 32 includes a first ferromagnetic layer 321 formed of a ferromagnetic substance. It is favorable for the first ferromagnetic layer 321 to have a film thickness of 0.5 nm or more and 30 nm or less.

The first ferromagnetic layer 321 of the fixed layer 32 includes a perpendicular magnetization M32 perpendicular to the XY plane, and a direction of the perpendicular magnetization M32 is fixed. In other words, even when a spin injection is performed on the storage device 3, the direction of the perpendicular magnetization M32 does not change in the first ferromagnetic layer 321. In the example shown in FIG. 3, the direction of the perpendicular magnetization M32 of the first ferromagnetic layer 321 is an upward Z-axis direction as indicated by the block arrow and is maintained in the upward Z-axis direction even when a spin injection is performed on the storage device 3.

The ferromagnetic substance forming the first ferromagnetic layer 321 of the fixed layer 32 can be determined as appropriate but is favorably a metal material including at least one of Co, Fe, and Ni as a main component or a boron alloy including at least one of Co, Fe, and Ni and B, for example. As an example, the first ferromagnetic layer 321 can be formed of CoFeB. Moreover, the first ferromagnetic layer 321 may include a configuration in which a plurality of layers respectively formed of different types of ferromagnetic substances are directly laminated on top of one another.

(Storage Layer)

The storage layer (also called "freedom layer", "free layer", etc.) 34 includes a second ferromagnetic layer 341 formed of a ferromagnetic substance and a heat generation layer 342 formed of a resistance heating element. The storage layer 34 is provided above and opposes the fixed layer 32 in the Z-axis direction. It is favorable for the second ferromagnetic layer 341 to have a film thickness of 0.5 nm or more and 30 nm or less.

The second ferromagnetic layer 341 of the storage layer 34 includes a perpendicular magnetization M34 perpendicular to the XY plane, and the perpendicular magnetization M34 can be inverted by a spin injection. In other words, as a spin injection is performed on the storage device 3, a direction of the perpendicular magnetization M34 becomes a direction corresponding to a spin torque of electrons in the second ferromagnetic layer 341. In the example shown in FIG. 3, the direction of the perpendicular magnetization M34 of the second ferromagnetic layer 341 can be inverted from the upward Z-axis direction to a downward Z-axis direction or from the downward Z-axis direction to the upward Z-axis direction by the spin injection to the storage device 3.

The ferromagnetic substance forming the second ferromagnetic layer 341 of the storage layer 34 can be determined as appropriate but is favorably a metal material including at least one of Co, Fe, and Ni as a main component or a boron alloy including at least one of Co, Fe, and Ni and B, for example. As an example, the second ferromagnetic layer 341 can be formed of CoFeB similar to the first ferromagnetic layer 321, but can also be formed of CoFeHf, CoFeW, CoFeTa, CoFeZr, CoFeNb, CoFeMo, CoFeNi, CoFeV, CoFeCr, CoFeNi, or the like.

Further, an accessory component may be added to the ferromagnetic substance forming the second ferromagnetic layer 341 of the storage layer 34 as necessary. By this addition of an accessory component, an improvement of heat resistance, an enhancement of a magnetoresistance effect, an improvement of a dielectric strength voltage, and the like can be obtained. Examples of such an accessory component include elemental substances, alloys, and oxides of B, C, N, O, F, Li, Mg, Si, P, Ti, V, Cr, Mn, Ni, Cu, Ge, Nb, Ru, Rh, Pd, Ag, Ta, Ir, Pt, Au, Zr, Hf, W, Mo, Re, and Os. Further, the second ferromagnetic layer 341 may include a configuration in which a plurality of layers respectively formed of different types of ferromagnetic substances are directly laminated on top of one another.

The heat generation layer 342 of the storage layer 34 includes a first function of lowering power consumption in a recording operation of the storage device 3 while maintaining an information retention property of the storage device 3, and a second function of suppressing an influence of a heat load on the perpendicular magnetization M34 of the second ferromagnetic layer 341. Details of the heat generation layer 342 will be given later.

(Intermediate Layer)

The intermediate layer 33 is formed of a nonmagnetic insulator and is arranged between the fixed layer 32 and the storage layer 34. The intermediate layer 33 is configured as a tunnel barrier layer of the MTJ device. In other words, in the storage device 3, as a voltage is applied in the Z-axis direction, a current flows in the intermediate layer 33 by a tunnel effect, and electrons having a spin torque in a certain direction are injected into the second ferromagnetic layer 341 of the storage layer 34.

In the storage device 3, a necessary current for inverting the perpendicular magnetization M34 of the second ferromagnetic layer 341 of the storage layer 34 becomes lower as the magnetoresistance change rate (MR ratio) becomes larger, so it becomes possible to realize low power consumption. In the storage device 3, a magnesium oxide (MgO) is used as the intermediate layer 33 for realizing a large MR ratio. It is favorable for the MgO film configuring the intermediate layer 33 to be crystallized and to have a crystalline orientation of (001).

It is favorable for the film thickness of the intermediate layer 33 to be determined such that an area resistance value becomes several ten $\Omega\mu m^2$ or less, for securing a sufficient current density for inverting the perpendicular magnetization M34 of the second ferromagnetic layer 341 of the storage layer 34. For example, in a case where the intermediate layer 33 is an MgO film, it is favorable for the intermediate layer 33 to have a thickness of 1.5 nm or less.

It should be noted that the material forming the intermediate layer 33 may be materials other than MgO and may be, for example, various insulators, derivatives, and semiconductors such as $Al_2O_3$, AlN, $SiO_2$, $Bi_2O_3$, $MgF_2$, CaF, $SrTiO_2$, $AlLa_3$, Al—N—O, and $MgAl_2O_4$.

(Base Layer)

The base layer 31 is arranged below the fixed layer 32 in the Z-axis direction. The base layer 31 includes a function as an electrode of the MTJ device, a function of controlling crystals of the fixed layer 32, and the like.

The base layer 31 can be configured as a layer that includes any one of Ta, Ti, Cu, TiN, TaN, NiCr, NiFeCr, Ru, and Pt as a main component, for example. It is favorable for the base layer 31 to be configured by a plurality of layers respectively formed of different materials. As an example, the base layer 31 may be configured by two layers including a layer formed of Ru and a layer formed of Ta.

(Cap Layer)

The cap layer 35 is arranged above the storage layer 34 in the Z-axis direction. The cap layer 35 covers an upper surface of the storage layer 34 in the Z-axis direction and includes a function of preventing oxidization of the storage layer 34 and the like.

The cap layer 35 can be configured as a metal layer including any one of Hf, Ta, W, Zr, Nb, Mo, Ti, Mg, V, Cr, Ru, Rh, Pd, and Pt as a main component, for example. Alternatively, the cap layer 35 may include a laminated structure configured by the metal layer and an oxide layer including any one of MgO, $Al_2O_3$, and $SiO_2$ as a main component. Other than those described above, the material forming the oxide layer may be, for example, $TiO_2$, $Bi_2O_3$, $SrTiO_2$, $AlLaO_3$, Al—N—O, $MgAl_2O_4$, or the like.

(Other Configurations)

The storage device 3 may include configurations other than those described above. For example, the storage device 3 may include a hard mask layer arranged above the cap layer 35 in the Z-axis direction. The hard mask layer can be formed of, for example, Ti, W, Ta, TiN, TaN, or the like. It should be noted that the hard mask layer may be provided in place of the cap layer 35.

[Heat Generation Layer]

(Schematic Configuration)

As shown in FIG. 3, the heat generation layer 342 of the storage layer 34 is adjacent to the second ferromagnetic layer 341 on a lower side in the Z-axis direction. The heat generation layer 342 is formed of a resistance heating element. The heat generation layer 342 mainly includes a first function and a second function described below. It is favorable for the heat generation layer 342 to have a thickness that falls within a range of 0.2 nm or more and 2.0 nm or less for favorably exhibiting the first function and the second function.

(First Function)

The first function of the heat generation layer 342 of the storage layer 34 is to lower power consumption in a recording operation of the storage device 3 while maintaining the information retention property of the storage device 3.

In general, the information retention property of the storage device 3, that is, the stability of the perpendicular magnetization M34 of the second ferromagnetic layer 341 of the storage layer 34, is expressed by Δ in Expression (1) below.

[Expression 1]

$$\Delta = \frac{KV}{k_B T} = \frac{M s V H k}{2 k_B T} \quad (1)$$

In Expression (1), K represents anisotropic energy, V represents a volume of the second ferromagnetic layer 341, $K_B$ represents a Boltzmann constant, Ms represents a saturation magnetization amount, Hk represents an effective anisotropy field, and T represents a temperature of the second ferromagnetic layer 341. Various elements such as a magnetic shape anisotropy, an induced magnetic anisotropy, and a crystal magnetic anisotropy are incorporated in the effective anisotropy field Hk, and the effective anisotropy field Hk becomes equivalent to a magnetic coercive force in a case where a single-domain simultaneous rotation model is presumed.

It is evaluated that, as the information retention property Δ expressed in Expression (1) becomes larger, the stability of the perpendicular magnetization M34 of the second ferromagnetic layer 341 becomes higher. Conversely, it is evaluated that, as the information retention property Δ becomes smaller, the stability of the perpendicular magnetization M34 of the second ferromagnetic layer 341 becomes lower. The storage device 3 is configured such that the information retention property Δ becomes sufficiently large in an ambient temperature (typically, room temperature) and is capable of favorably retaining recorded information.

On the other hand, as the information retention property Δ becomes larger, the stability of the perpendicular magnetization M34 of the second ferromagnetic layer 341 becomes higher, and it becomes difficult for the perpendicular magnetization M34 of the second ferromagnetic layer 341 to be inverted. Accordingly, a large current becomes necessary for inverting the perpendicular magnetization M34 of the second ferromagnetic layer 341 in the recording operation, so power consumption during the recording operation increases. In this regard, in the storage device 3, power consumption during the recording operation is lowered by lowering the information retention property Δ only for a moment during the recording operation by an operation of the heat generation layer 342.

More specifically, as a spin injection is performed on the storage device 3, a current flows in the heat generation layer 342 formed of a resistance heating element to generate Joule heat. By this Joule heat, the temperature of the second ferromagnetic layer 341 adjacent to the heat generation layer 342 increases. In other words, in the storage device 3, the temperature of the second ferromagnetic layer 341 rises only for a moment during the recording operation.

Here, referring to Expression (1), it can be seen that since the information retention property Δ is proportional to a reciprocal number of the temperature T of the second ferromagnetic layer 341, the information retention property Δ becomes smaller as the temperature T of the second ferromagnetic layer 341 becomes higher. In other words, in the storage device 3, by the temperature of the second ferromagnetic layer 341 rising only for a moment during the recording operation, the information retention property Δ becomes small, and the stability of the perpendicular magnetization M34 of the second ferromagnetic layer 341 is lowered. Therefore, since the perpendicular magnetization M34 of the second ferromagnetic layer 341 can be inverted by a small current during the recording operation in the storage device 3, power consumption in the recording operation can be reduced.

Further, since the temperature of the second ferromagnetic layer 341 returns to the ambient temperature right after the recording operation in the storage device 3, a sufficiently-large information retention property Δ is maintained except for that moment in the recording operation. In this way, in the storage device 3, power consumption in the recording operation can be reduced without impairing the information retention property Δ, due to the operation of the heat generation layer 342.

(Second Function)

It is generally known that in the MTJ device, a property is largely deteriorated by a heat load of 350° C. or more. Specifically, in some cases, a perpendicular magnetic anisotropy of the ferromagnetic layers (first ferromagnetic layer 321 and second ferromagnetic layer 341 in this embodiment) included in the MTJ device may be eliminated by the heat load of 350° C. or more so that it becomes impossible to record information by inversion of the perpendicular magnetizations.

In contrast, the second function of the heat generation layer 342 of the storage layer 34 is to suppress the influence of a heat load on the perpendicular magnetization M34 of the second ferromagnetic layer 341. Specifically, also in a case where a heat load is applied to the storage device 3 in the production process of the storage apparatus 20, the processing of mounting the storage apparatus 20 to various electronic apparatuses, and the like, the perpendicular magnetization M34 of the second ferromagnetic layer 341 is less likely to be impaired.

More specifically, the heat generation layer 342 of the storage layer 34 includes high heat resistance since it is formed of a resistance heating element, and even when a heat load is applied thereto, physical and chemical changes are less likely to occur. By providing the heat generation layer 342 including high heat resistance in the storage device 3, the perpendicular magnetization M34 of the second ferromagnetic layer 341 adjacent to the heat generation layer 342 is less likely to be influenced by the heat load. Accordingly, the magnetic anisotropy of the MTJ device is maintained favorably, and high reliability as the storage device 3 can thus be obtained.

Specifically, the temperature of the storage device 3 may rise up to about 400° C. in a CVD (Chemical Vapor Deposition) process in the production of the storage apparatus 20. Also in a case where such a situation is assumed and the storage device 3 is subjected to 3 hours of heat processing at 400° C., it was confirmed that the perpendicular magnetization M34 of the second ferromagnetic layer 341 is not impaired due to the operation of the heat generation layer 342.

(Resistance Heating Element Forming Heat Generation Layer)

As the resistance heating element for forming the heat generation layer 342, a material that is capable of appropriately raising a temperature of the second ferromagnetic layer 341 by Joule heat and includes heat resistance that operates so as not to impair the perpendicular magnetization M34 of the second ferromagnetic layer 341 can be adopted. As such a resistance heating element, a nitride, carbide, boride, oxide, elemental carbon, or elemental boron can be selected, for example.

More specifically, as the resistance heating element, for example, TiN, ZrN, HfN, VN, NbN, TaN, CrN, MoN, WN, SiN, AlN, BN, TiC, ZrC, HfC, VC, NbC, TaC, $Cr_3C_2$, $Mo_2C$, WC, SiC, AlC, $B_4C$, $TiB_2$, $ZrB_2$, $HfB_2$, $VB_2$, $NbB_2$, $TaB_2$, $CrB_2$, $Mo_2B_5$, $W_2B$, $B_2O_3$, B, C, and the like can be used as an elemental substance or a mixture thereof.

It is favorable to configure the resistance heating element by a material including an electrical resistivity of 1 Ωm or more and $1*10^4$ Ωm or less at 20° C. from the viewpoint of appropriately raising the temperature of the second ferromagnetic layer 341. The resistance heating element may be configured by a single type of material including the electrical resistivity as described above, or an electrical resistivity of a compound material obtained by mixing a plurality of types of materials may be adjusted to the electrical resistivity as described above. It should be noted that the electrical resistivity of the resistance heating element may either be a property value obtained before deposition or a property value obtained after deposition.

Modified Example 1

Figure 4:
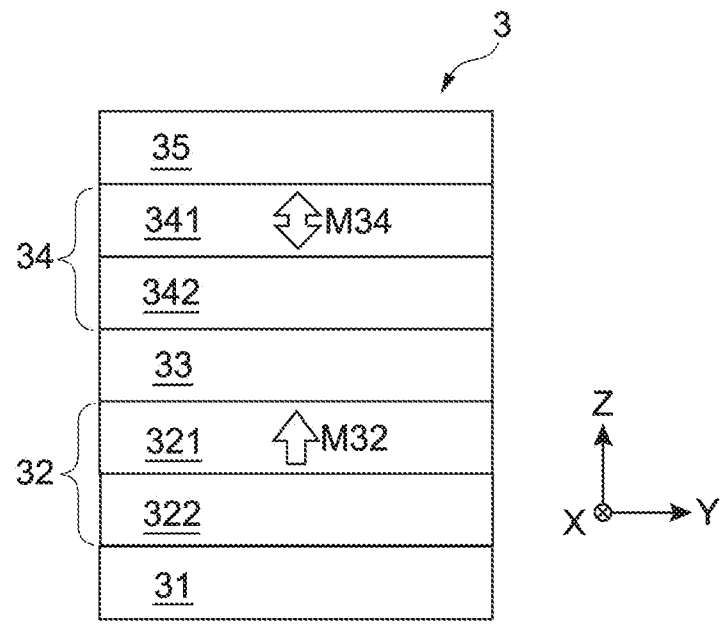
FIG. 4 A cross-sectional diagram schematically showing a modified example of the storage device.

FIG. 4 is a cross-sectional diagram schematically showing the storage device 3 according to Modified Example 1. In the storage device 3 according to this modified example, a heat generation layer 322 is provided not only in the storage layer 34 but also in the fixed layer 32. The heat generation layer 322 is arranged below the first ferromagnetic layer 321 in the Z-axis direction. The heat generation layer 322 of the fixed layer 32 includes functions similar to those of the heat generation layer 342 of the storage layer 34.

Specifically, although the heat generation layer 322 of the fixed layer 32 is farther away from the second ferromagnetic layer 341 than the heat generation layer 342 of the storage layer 34, the heat generation layer 322 generates Joule heat during a recording operation of the storage device 3 and facilitates temperature raise of the second ferromagnetic layer 341. Accordingly, power consumption in the recording operation of the storage device 3 can be reduced more effectively.

Further, by providing the heat generation layer 322 including heat resistance also in the fixed layer 32 in the storage device 3 according to this modified example, the perpendicular magnetization M32 of the first ferromagnetic layer 321 adjacent to the heat generation layer 322 is also less likely to be influenced by a heat load. In other words, both the perpendicular magnetization M32 of the first ferromagnetic layer 321 and the perpendicular magnetization M34 of the second ferromagnetic layer 341 are less likely to be influenced by the heat load. Accordingly, the magnetic anisotropy of the MTJ device is maintained favorably, and higher reliability as the storage device 3 can thus be obtained.

It should be noted that the positions of the second ferromagnetic layer 341 and heat generation layer 342 in the storage layer 34 and the positions of the first ferromagnetic layer 321 and heat generation layer 322 in the fixed layer 32 may be set to be opposite from those of the configuration shown in FIG. 4. In other words, the heat generation layer 342 may be arranged above the second ferromagnetic layer 341 in the Z-axis direction in the storage layer 34, and the heat generation layer 322 may be arranged above the first ferromagnetic layer 321 in the Z-axis direction in the fixed layer 32.

Modified Example 2

FIGS. 5(A), 5(B), 5(C), and 5(D) are cross-sectional diagrams each schematically showing the storage layer 34 according to Modified Example 2. The storage layer 34 according to this modified example includes, in addition to the heat generation layer 342 similar to that of the embodiment above, two second ferromagnetic layers 341U and 341L and a nonmagnetic layer 343. The nonmagnetic layer 343 is arranged between the two second ferromagnetic layers 341U and 341L.

The second ferromagnetic layers 341U and 341L can both be formed of a ferromagnetic substance similar to that of the second ferromagnetic layer 341 according to the embodiment above and can be formed of, for example, Fe, Co, FeNi, CoFe, CoFeB, FeB, CoB, and the like. The ferromagnetic substances forming the two second ferromagnetic layers 341U and 341L may also mutually differ. The nonmagnetic layer 343 can be formed of an elemental substance, alloy, oxide, and nitride of V, Cr, Nb, Mo, Ta, W, Hf, Zr, Ti, Ru, and Mg, for example.

The position of the heat generation layer 342 differs in the configurations of the storage layer 34 shown in FIGS. 5(A), 5(B), 5(C), and 5(D).

Figure 5A:
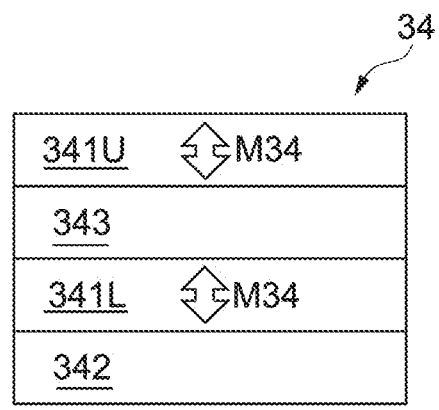
FIGS. 5(A), 5(B), 5(C), and 5(D) Cross-sectional diagrams each schematically showing a modified example of a storage layer of the storage device.

Specifically, in the configuration shown in FIG. 5(A), the heat generation layer 342 is adjacent to the lower side of the lower-side second ferromagnetic layer 341L in the Z-axis direction.

Figure 5B:
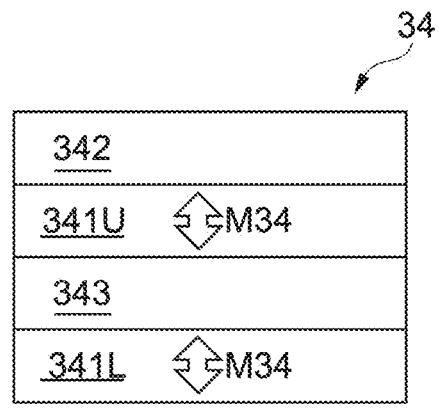

In the configuration shown in FIG. 5(B), the heat generation layer 342 is adjacent to the upper side of the upper-side second ferromagnetic layer 341U in the Z-axis direction.

Figure 5C:
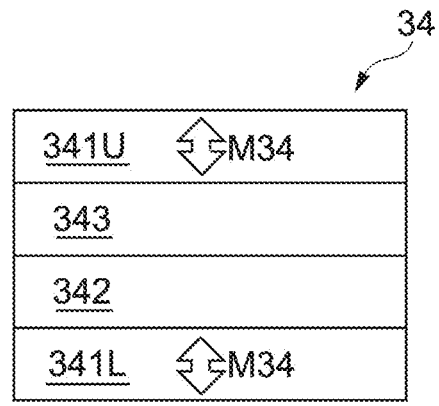

In the configuration shown in FIG. 5(C), the heat generation layer 342 is adjacent to the upper side of the lower-side second ferromagnetic layer 341L in the Z-axis direction.

Figure 5D:
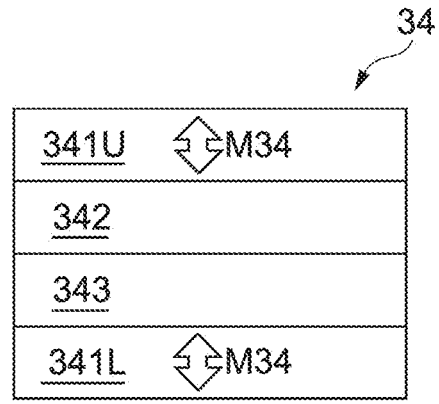

In the configuration shown in FIG. 5(D), the heat generation layer 342 is adjacent to the lower side of the upper-side second ferromagnetic layer 341U in the Z-axis direction.

In any of the configurations shown in FIGS. 5(A), 5(B), 5(C), and 5(D), the heat generation layer 342 can exert functions similar to those of the embodiment above.

It should be noted that the storage layer 34 may include a plurality of heat generation layers 342. Specifically, the heat generation layers 342 may be arranged at both the position adjacent to the lower-side second ferromagnetic layer 341L and the position adjacent to the upper-side second ferromagnetic layer 341U.

Modified Example 3

FIGS. 6(A), 6(B), 6(C), and 6(D) are cross-sectional diagrams each schematically showing the fixed layer 32 according to Modified Example 3. The fixed layer 32 according to this modified example includes, in addition to the heat generation layer 322 similar to that of Modified Example 1 above, two first ferromagnetic layers 321U and 321L and a nonmagnetic layer 323. The nonmagnetic layer 323 is arranged between the two first ferromagnetic layers 321U and 321L.

The fixed layer 32 according to this modified example includes a so-called laminated ferrimagnetic structure. Directions of the perpendicular magnetizations M32 of the two first ferromagnetic layers 321U and 321L of the fixed layer 32 are opposite to each other, that is, antiparallel. In the examples shown in FIGS. 6(A), 6(B), 6(C), and 6(D), the lower-side first ferromagnetic layer 321L faces downward in the Z-axis direction, and the upper-side first ferromagnetic layer 321U faces upward in the Z-axis direction. By setting the directions of the perpendicular magnetizations M32 of the two first ferromagnetic layers 321U and 321L to be opposite to each other in this way, a leak field in the fixed layer 32 can be suppressed to thus prevent the storage layer 34 from being influenced by the leak field.

The two first ferromagnetic layers 321U and 321L can be formed of a material including at least one of Co, Fe, and Ni and at least one of Pt, Pd, Rh, and Ni as main components and can be formed of, for example, CoPt or FePt. The ferromagnetic substances forming the two first ferromagnetic layers 321U and 321L may also mutually differ. It should be noted that at least one of the two first ferromagnetic layers 321U and 321L may be formed of a material similar to that of the first ferromagnetic layer 321 according to the embodiment above, such as Fe, Co, FeNi, CoFe, CoFeB, FeB, and CoB.

The nonmagnetic layer 323 can be formed of an elemental substance or alloy of Ru, Os, Re, Ir, Au, Ag, Cu, Al, Bi, Si, B, C, Cr, Ta, Pd, Pt, Zr, Hf, W, Mo, Nb, V, and Ti, for example.

The position of the heat generation layer 322 differs in the configurations of the fixed layer 32 shown in FIGS. 6(A), 6(B), 6(C), and 6(D).

Specifically, in the configuration shown in FIG. 6(A), the heat generation layer 322 is adjacent to the lower side of the lower-side first ferromagnetic layer 321L in the Z-axis direction.

In the configuration shown in FIG. 6(B), the heat generation layer 322 is adjacent to the upper side of the upper-side first ferromagnetic layer 321U in the Z-axis direction.

In the configuration shown in FIG. 6(C), the heat generation layer 322 is adjacent to the upper side of the lower-side first ferromagnetic layer 321L in the Z-axis direction.

In the configuration shown in FIG. 6(D), the heat generation layer 322 is adjacent to the lower side of the upper-side first ferromagnetic layer 321U in the Z-axis direction.

In any of the configurations shown in FIGS. 6(A), 6(B), 6(C), and 6(D), the heat generation layer 322 can exert functions similar to those of Modified Example 1 above.

It should be noted that the fixed layer 32 may include a plurality of heat generation layers 322. Specifically, the heat generation layers 322 may be arranged at both the position adjacent to the lower-side first ferromagnetic layer 321L and the position adjacent to the upper-side first ferromagnetic layer 321U.

Further, the fixed layer 32 may include a configuration that uses an antiferromagnetic layer or a soft magnetic layer. The antiferromagnetic layer can be formed of, for example, FeMn, PtMn, PtCrMn, NiMn, IrMn, NiO, $Fe_2O_3$, and the like. Moreover, regarding the two first ferromagnetic layers 321U and 321L, various physical properties such as a magnetic property, a crystalline structure, a crystalline property, and a stability can be adjusted by adding nonmagnetic elements such as Ag, Cu, Au, Al, Si, Bi, Ta, B, C, O, N, Pd, Pt, Zr, Ta, Hf, Ir, W, Mo, and Nb.

Modified Example 4

Figure 7:
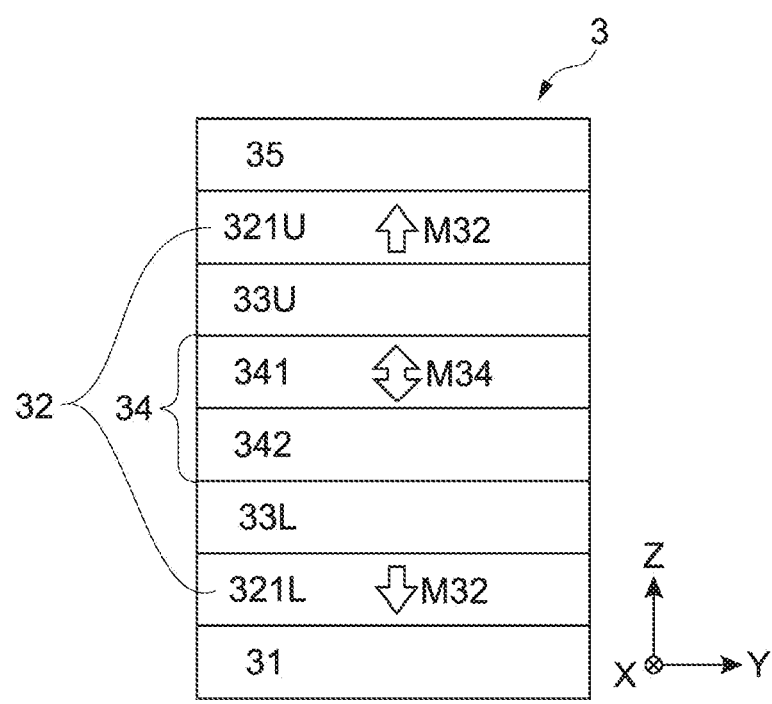
FIG. 7 A cross-sectional diagram schematically showing a modified example of the storage device.

FIG. 7 is a cross-sectional diagram schematically showing the storage device 3 according to Modified Example 4. The fixed layer 32 according to this modified example is divisionally provided above and below the storage layer 34 in the Z-axis direction. Specifically, the upper-side first ferromagnetic layer 321U is provided above the storage layer 34 in the Z-axis direction, and the lower-side first ferromagnetic layer 321L is provided below the storage layer 34 in the Z-axis direction. The perpendicular magnetizations M32 of the two first ferromagnetic layers 321U and 321L of the fixed layer 32 face mutually opposite directions.

Also in the storage device 3 according to this modified example, two intermediate layers 33U and 33L are provided in correspondence with the first ferromagnetic layers 321U and 321L that are provided divisionally. Specifically, the intermediate layer 33U is provided between the first ferromagnetic layer 321U and the storage layer 34, and the intermediate layer 33L is provided between the first ferromagnetic layer 321L and the storage layer 34. The configuration of this modified example also bears effects similar to those of the embodiment above.

It should be noted that the fixed layer 32 of the storage device 3 according to this modified example may include the heat generation layer 322. Specifically, the heat generation layer 322 may be arranged at at least one of the position adjacent to the lower-side first ferromagnetic layer 321L and the position adjacent to the upper-side first ferromagnetic layer 321U.

[Evaluation of Storage Device]
(Magnetic Property)

For confirming the operation of the heat generation layer 342 in the storage device 3, the magnetic property was evaluated in samples S11 and S12 having configurations in which the fixed layer 32 is not provided in the storage device.

Figure 8A:
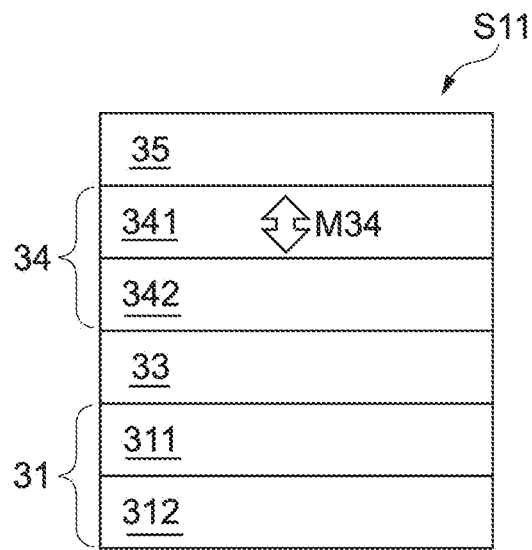
FIGS. 8(A) and 8(B) Cross-sectional diagrams each schematically showing a sample for evaluating the storage layer of the storage device.
Figure 8B:
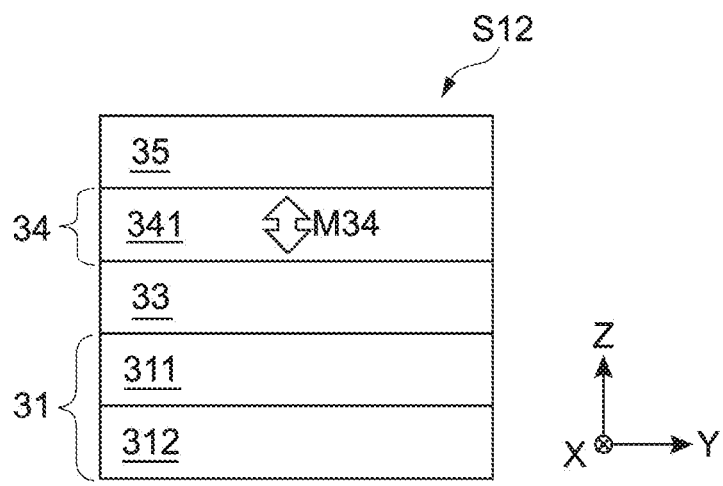

FIG. 8(A) is a cross-sectional diagram schematically showing the sample S11, and FIG. 8(B) is a cross-sectional diagram schematically showing the sample S12. The samples S11 and S12 are both configured by the base layer 31, the intermediate layer 33, the storage layer 34, and the cap layer 35. The sample S11 includes the heat generation layer 342, and the sample S12 does not include the heat generation layer 342. The configuration excluding the heat generation layer 342 is common to the samples S11 and S12. Therefore, by comparing the samples S11 and S12, the operation of the heat generation layer 342 with respect to the magnetic property of the storage layer 34 can be confirmed.

As the common configuration of the samples S11 and S12, the base layer 31 is configured as a laminated film constituted of a Ta layer 312 having a film thickness of 5.0 nm and an Ru layer 311 having a film thickness of 5.0 nm.

The intermediate layer 33 is configured as an MgO film having a film thickness of 1.0 nm.

The second ferromagnetic layer 341 of the storage layer 34 is configured as a CoFeB film having a film thickness of 1.5 nm.

The cap layer 35 is configured as a Ta film having a film thickness of 5.0 nm.

The heat generation layer 342 of the sample S11 is configured as a resistance heating element film having a film thickness of 0.2 nm. The heat generation layer 342 was formed by a resistance heating element that is configured by at least one of a nitride, carbide, boride, oxide, elemental carbon, and elemental boron and includes an electrical resistivity of 1 $\Omega$m or more and $1*10^4$ $\Omega$m or less at 20° C.

After subjecting the prepared samples S11 and S12 to heat processing at 400° C. for 3 hours, the magnetic properties were measured.

Figure 9A:
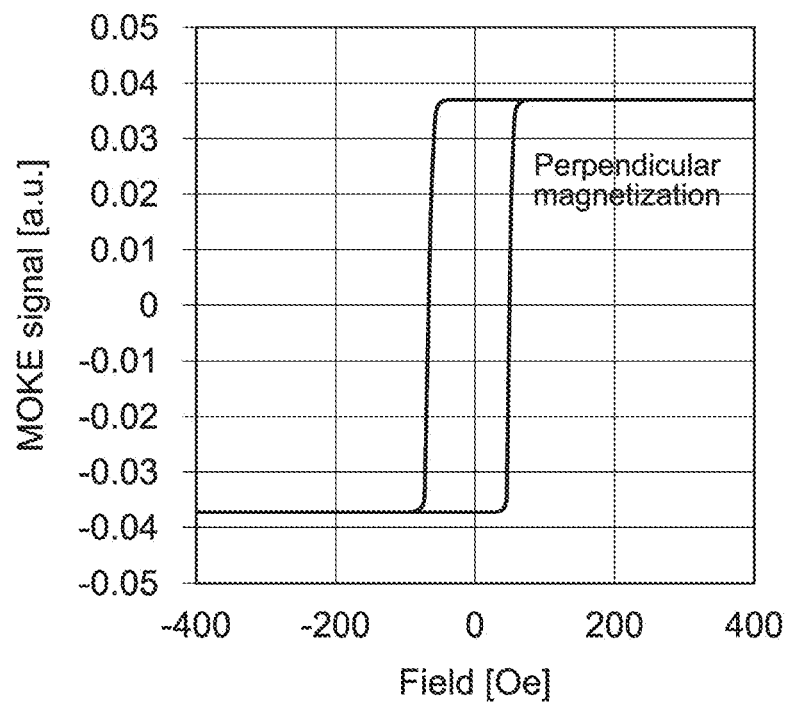
FIGS. 9(A) and 9(B) Diagrams showing measurement results of a magnetic property of the storage layer of the storage device.
Figure 9B:
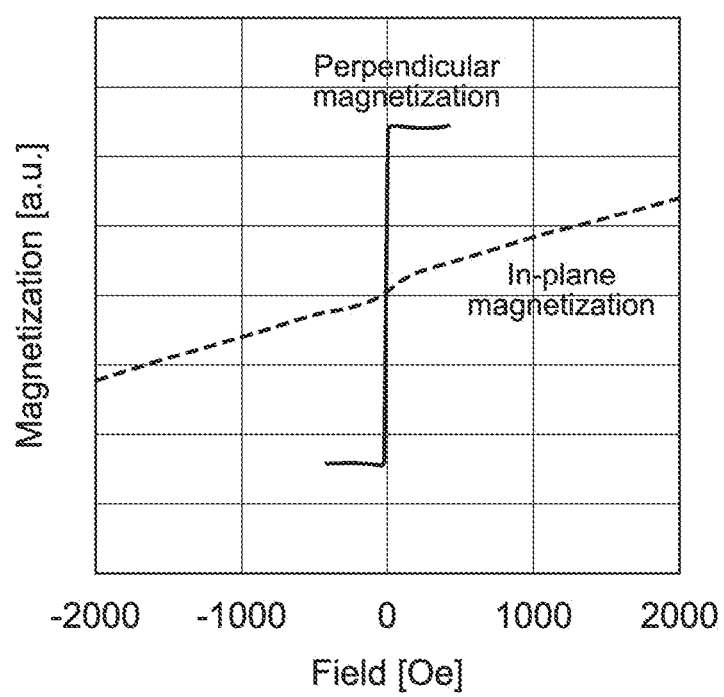

FIGS. 9(A) and 9(B) are diagrams showing measurement results of the magnetic property of the sample S11. FIG. 9(A) is a graph showing a result of a magneto-optical effect (MOKE: Magneto-optical Kerr Effect) measurement, and FIG. 9(B) is a graph showing a measurement result obtained by a vibrating sample magnetometer (VSM: Vibrating Sample Magnetometer: VSM).

As shown in FIG. 9(A), in the sample S11, a rectangular MOKE waveform of a high aspect ratio, that indicates an extremely-clear perpendicular magnetic anisotropy, was obtained by the MOKE measurement. Further, as shown in FIG. 9(B), in the sample S11, a waveform indicating a sufficiently-large perpendicular magnetic anisotropy was obtained also in the measurement using the VSM. Accordingly, it was confirmed that also after the heat processing at 400° C. for 3 hours, the perpendicular magnetization M34 of the second ferromagnetic layer 341 of the storage layer 34 was maintained favorably in the sample S11.

Figure 10:
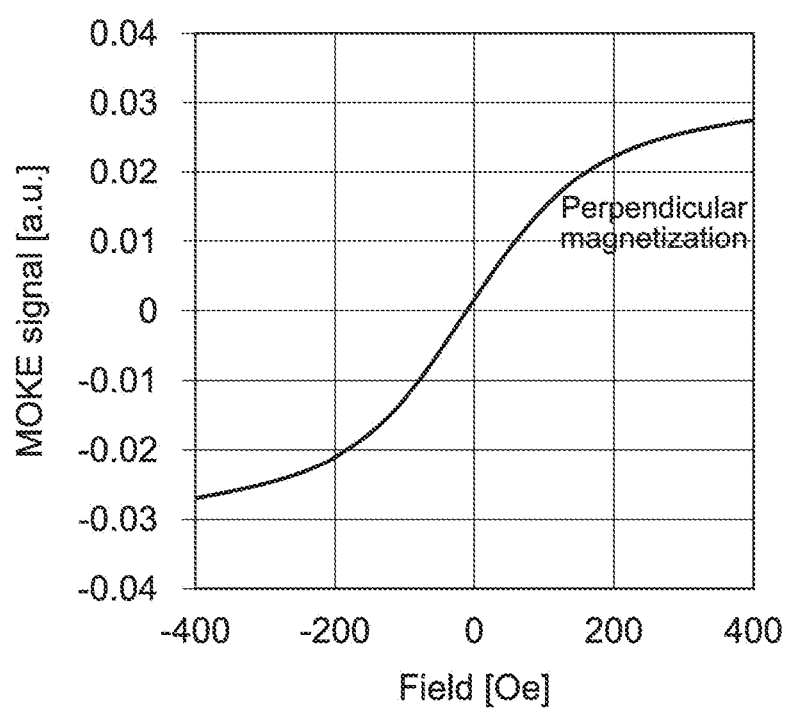
FIG. 10 A diagram showing a measurement result of a magnetic property of a storage layer according to a comparative example.

FIG. 10 is a graph showing a VSM measurement result on the sample S12. As shown in FIG. 10, it can be seen that in the sample S12, a waveform indicating a perpendicular magnetic anisotropy is not obtained in the VSM measurement and that the perpendicular magnetic anisotropy is lost. Accordingly, it was confirmed that in the sample S12, the perpendicular magnetization M34 of the second ferromagnetic layer 341 of the storage layer 34 is lost by the heat processing at 400° C. for 3 hours.

By the above comparison of the samples S11 and S12, it was confirmed that the perpendicular magnetization M34 of the second ferromagnetic layer 341 of the storage layer 34 is favorably maintained in the sample S11 by the operation of the heat generation layer 342.

(Information Retention Property Δ and Information Writing Current Density Jc0)

For confirming the operation of the heat generation layer 342 in the storage device 3, the information retention property Δ and information writing current density Jc0 of samples S21 and S22 of the storage device were evaluated.

Figure 11A:
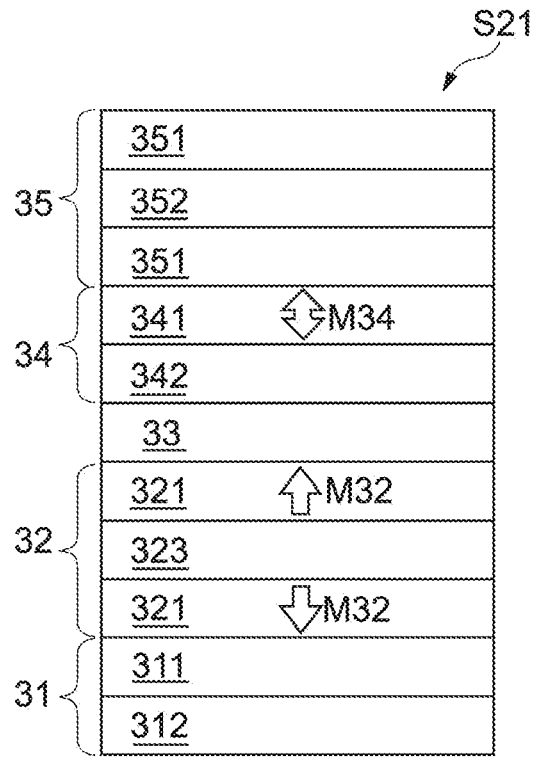
FIGS. 11(A) and 11(B) Cross-sectional diagrams each schematically showing a sample for evaluating an information retention property of the storage device and an information writing current density.
Figure 11B:
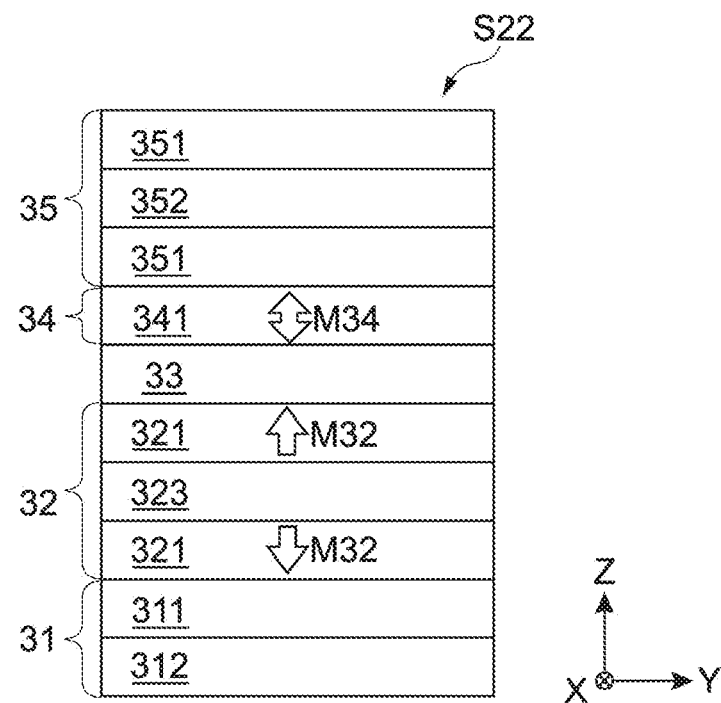

FIG. 11(A) is a cross-sectional diagram schematically showing the sample S21, and FIG. 11(B) is a cross-sectional diagram schematically showing the sample S22. The samples S21 and S22 were each formed on a thermally-oxidized film that has a thickness of 300 nm and is provided on a silicon substrate having a thickness of 0.725 mm.

The samples S21 and S22 are both configured by the base layer 31, the fixed layer 32, the intermediate layer 33, the storage layer 34, and the cap layer 35. The sample S21 includes the heat generation layer 342, and the sample S22 does not include the heat generation layer 342. The configuration excluding the heat generation layer 342 is common to the samples S21 and S22. Therefore, by comparing the samples S21 and S22, the operation of the heat generation layer 342 with respect to the information retention property Δ and information writing current density Jc0 can be confirmed.

As the common configuration of the samples S21 and S22, the base layer 31 is configured as a laminated film constituted of a Ta layer 312 having a film thickness of 5.0 nm and an Ru layer 311 having a film thickness of 5.0 nm.

The fixed layer 32 includes a laminated ferrimagnetic structure constituted of the first ferromagnetic layer 321 that is formed of CoPt and has a film thickness of 2.5 nm, the nonmagnetic layer 323 that is formed of Ru and has a film thickness of 0.8 nm, and first ferromagnetic layer 321 that is formed of CoPt and has a film thickness of 2.5 nm.

The intermediate layer 33 is configured as an MgO film having a film thickness of 1.0 nm.

The second ferromagnetic layer 341 of the storage layer 34 is configured as a CoFeB film having a film thickness of 1.5 nm.

The cap layer 35 is configured as a laminated film constituted of a Ta film 351 having a film thickness of 3.0 nm, an Ru film 352 having a film thickness of 3.0 nm, and a Ta film 351 having a film thickness of 3.0 nm.

The heat generation layer 342 of the sample S21 is configured as a resistance heating element film having a film thickness of 0.2 nm. The heat generation layer 342 was formed by a resistance heating element that is configured by at least one of a nitride, carbide, boride, oxide, elemental carbon, and elemental boron and includes an electrical resistivity of 1 Ωm or more and $1*10^4$ Ωm or less at 20° C.

The prepared samples S21 and S22 were subjected to first heat processing at 350° C. for 1 hour and second heat processing at 400° C. for 3 hours. After each of the heat processing, the information retention property Δ and information writing current density Jc0 were obtained for each of the samples S21 and S22. The information retention property Δ was calculated from a result of a temperature acceleration retention test. The information writing current density Jc0 was calculated from a pulse width dependency of a magnetization inversion current Ic. Table 1 shows the information retention property Δ and information writing current density Jc0 of the samples S21 and S22 obtained after each of the heat processing.

TABLE 1

|  | Sample S21 | | Sample S22 | |
| --- | --- | --- | --- | --- |
|  | After 1st heat processing (350° C./1 hour) | After 2nd heat processing (400° C./3 hours) | After 1st heat processing (350° C./1 hour) | After 2nd heat processing (400° C./3 hours) |
| Δ | 65 | 62 | 38 | — |
| Jc0 [a.u.] | 0.8 | 0.8 | 1.0 | — |

As shown in Table 1, the information retention property Δ obtained after the first heat processing was 38 in the sample S22 whereas it was 65 in the sample S21. Accordingly, it can be seen that, by the operation of the heat generation layer 342, the information retention property Δ obtained after the first heat processing largely increases so that the perpendicular magnetization M34 of the second ferromagnetic layer 341 of the storage layer 34 is less likely to be impaired.

On the other hand, the information writing current density Jc0 obtained after the first heat processing was 1.0 in the sample S22 whereas it was 0.8 in the sample S21. Accordingly, it can be seen that the information writing current density Jc0 is reduced 20% by the operation of the heat generation layer 342.

By the above comparison of the samples S21 and S22 after the first heat processing, it was confirmed that the information retention property Δ of the storage device is improved and power consumption in the recording operation of the storage device is reduced by the operation of the heat generation layer 342.

Further, in the sample S21, the information retention property Δ and information writing current density Jc0 equivalent to those obtained after the first heat processing were obtained also after the second heat processing. On the other hand, in the sample S22 after the second heat processing, the perpendicular magnetic anisotropy was lost, and the information retention property Δ and information writing current density Jc0 were not obtained.

From the results described above, it was confirmed that in the sample S21, both the information retention property Δ and the information writing current density Jc0 are not impaired due to the operation of the heat generation layer 342 even after the first heat processing at 350° C. for 1 hour and the second heat processing at 400° C. for 3 hours.

[Application Example of Storage Device]

The storage device 3 according to the embodiment above is applicable to not only the storage apparatus 20 but also a magnetic head, various electronic apparatuses, and the like. Hereinafter, as an example of this, a magnetic head including the storage device 3 and an electronic apparatus including the storage device 3 will be described.

(Magnetic Head)

Figure 12A:
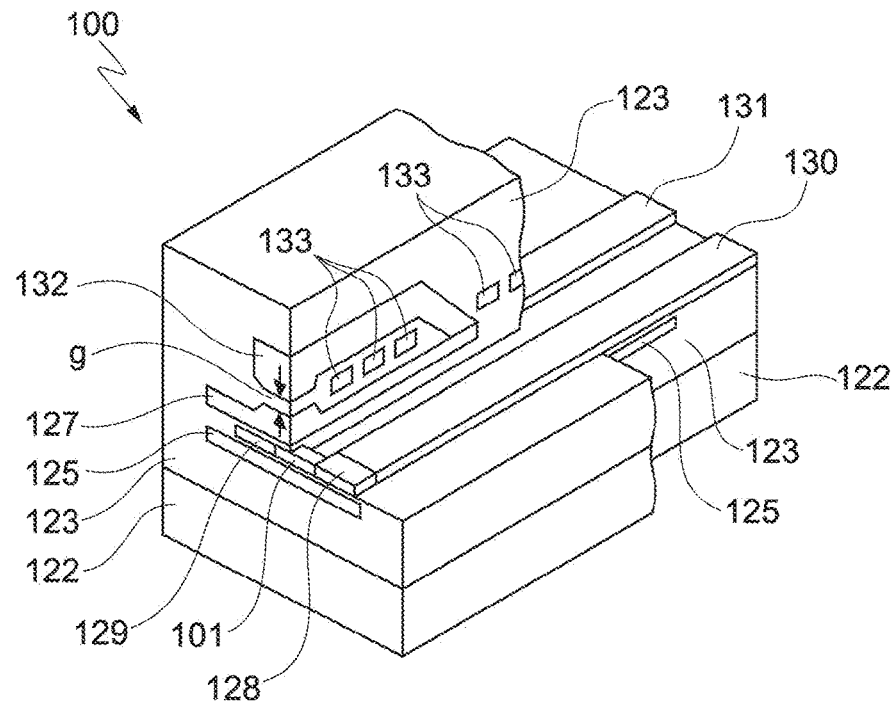
FIGS. 12(A) and 12)B) Diagrams schematically showing a magnetic head including the storage apparatus.
Figure 12B:
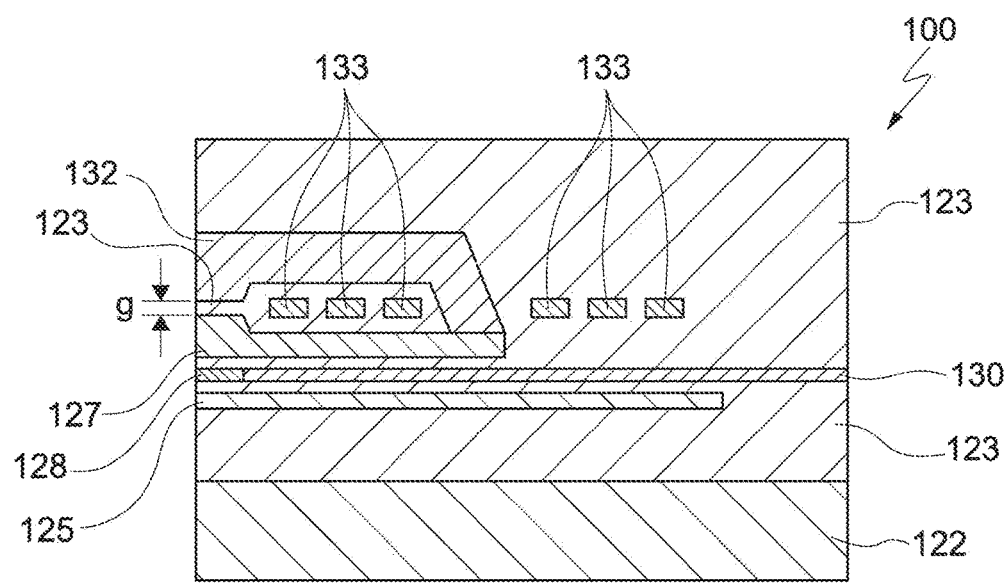

FIGS. 12(A) and 12(B) are diagrams schematically showing a compound magnetic head 100. FIG. 12(A) is a perspective view of the compound magnetic head 100, and FIG. 12(B) is a cross-sectional diagram of the compound magnetic head 100. In FIG. 12(A), the compound magnetic head 100 is partially notched to help understand an internal structure thereof. The compound magnetic head 100 includes a magneto-sensitive device 101 which is a magnetic device including a laminated structure having a configuration similar to that of the storage device 3 according to the embodiment above.

The compound magnetic head 100 can be used in a hard disk apparatus, for example. The compound magnetic head 100 includes a substrate 122 and a magnetoresistance-effect-type magnetic head formed on the substrate 122. The compound magnetic head 100 also includes an inductive-type magnetic head laminated on the magnetoresistance-effect-type magnetic head.

In the compound magnetic head 100, the magnetoresistance-effect-type magnetic head functions as a reproduction head, and the inductive-type magnetic head functions as a recording head. In other words, the compound magnetic head 100 includes a configuration in which the reproduction head and the recording head are combined.

The magnetoresistance-effect-type magnetic head of the compound magnetic head 100 is a so-called shield-type MR head. The magnetoresistance-effect-type magnetic head includes a first magnetic shield 125, the magneto-sensitive device 101, and a second magnetic shield 127. The first magnetic shield 125 is formed on the substrate 122 via an insulation layer 123. The magneto-sensitive device 101 is formed on the first magnetic shield 125 via the insulation layer 123. The second magnetic shield 127 is formed on the magneto-sensitive device 101 via the insulation layer 123.

The insulation layer 123 is formed of an insulation material such as $Al_2O_3$ and $SiO_2$, for example. The first magnetic shield 125 is formed of a soft magnetic substance such as Ni—Fe and magnetically shields a lower layer side of the magneto-sensitive device 101, for example. Similarly, the second magnetic shield 127 magnetically shields an upper layer side of the magneto-sensitive device 101.

In the magnetoresistance-effect-type magnetic head, the magneto-sensitive device 101 detects magnetic signals from a magnetic recording medium. The magneto-sensitive device 101 is substantially rectangular, and one side surface thereof is exposed to an opposing surface of the magnetic recording medium. Bias layers 128 and 129 are connected to both ends of the magneto-sensitive device 101, and connection terminals 130 and 131 are further connected to the bias layers 128 and 129. With such a configuration, a sense current can be supplied to the magneto-sensitive device 101 via the connection terminals 130 and 131.

The inductive-type magnetic head of the compound magnetic head 100 includes a magnetic core and a thin-film coil 133. The magnetic core is configured by the second magnetic shield 127 and an upper-layer core 132. The thin-film coil 133 is formed so as to be wound around the magnetic core.

The upper-layer core 132 configuring the magnetic core is formed of a soft magnetic substance such as Ni—Fe, for example, and forms a closed magnetic path with the second magnetic shield 127. Front end portions of the second magnetic shield 127 and the upper-layer core 132 are set apart so as to form a predetermined gap g, and both are exposed to the opposing surface of the magnetic recording medium. The gap g between the second magnetic shield 127 and the upper-layer core 132 configures a recording magnetic gap of the inductive-type magnetic head. The second magnetic shield 127 and the upper-layer core 132 are connected at rear end portions thereof.

The thin-film coil 133 embedded in the insulation layer 123 is formed between the second magnetic shield 127 and the upper-layer core 132. The thin-film coil 133 is formed so as to be wound around the magnetic core constituted of the second magnetic shield 127 and the upper-layer core 132 in an in-plane direction. Although not shown in FIGS. 12(A) and 12(B), terminals are provided at both end portions of the thin-film coil 133. Each of the terminals of the thin-film coil 133 is externally exposed and configures an external connection terminal of the inductive-type magnetic head. In other words, by supplying a recording current to each of the terminals of the thin-film coil 133, magnetic signals can be recorded onto the magnetic recording medium.

Since the magneto-sensitive device 101 of the compound magnetic head 100 includes a configuration similar to that of the storage device 3 according to the embodiment above, both a high information retention property Δ and low power consumption are realized. In other words, it is possible to perform more-accurate reproduction operations by low power consumption in the compound magnetic head 100 equipped with the magneto-sensitive device 101.

(Electronic Apparatus)

Figure 13:
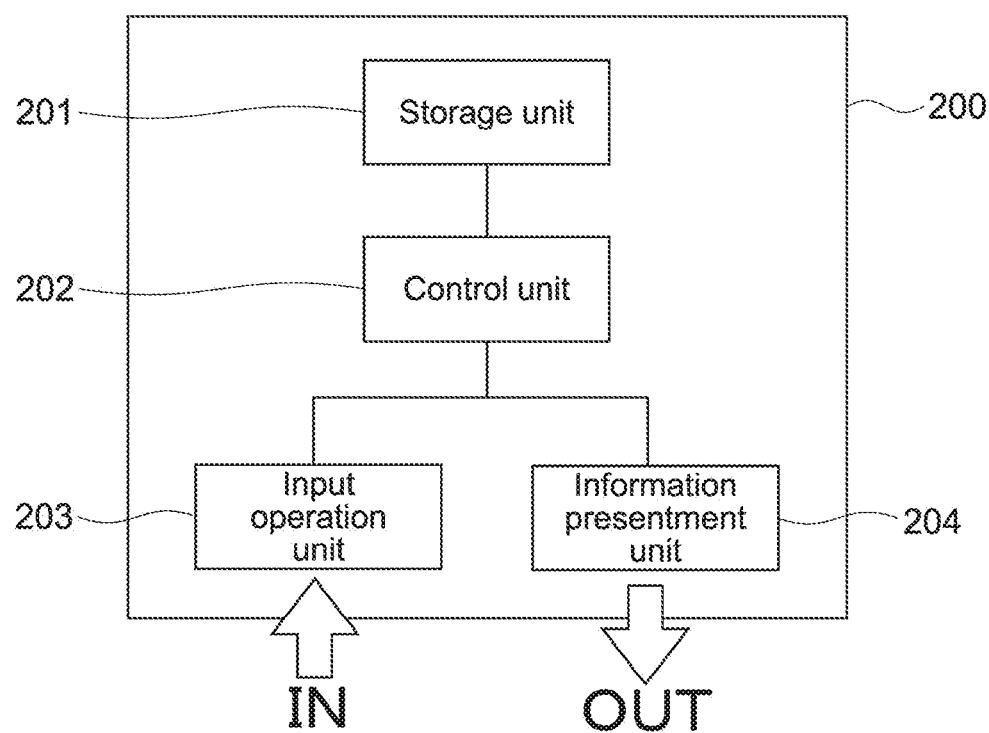
FIG. 13 A block diagram showing a schematic configuration of an electronic apparatus including the storage apparatus.

FIG. 13 is a block diagram showing a schematic configuration of an electronic apparatus 200 including the storage device 3 or the storage apparatus 20 according to this embodiment. The electronic apparatus 200 includes the storage device 3 or the storage apparatus 20 of this embodiment as a storage unit 201. Examples of the electronic apparatus 200 include various computers, a mobile terminal apparatus, a game apparatus, a music apparatus, and a video apparatus.

The electronic apparatus 200 includes a control unit 202 capable of accessing the storage unit 201.

The electronic apparatus 200 may also include an input operation unit 203, for example. In this case, the control unit 202 is capable of recording information corresponding to a content of a user operation with respect to the input operation unit 203 in the storage unit 201.

Further, the electronic apparatus 200 may also include an information presentment unit 204 capable of displaying videos and reproducing audio, for example. The information presentment unit 204 is typically configured as a display apparatus, a speaker, or the like. In this case, the control unit 202 is capable of reading information recorded in the storage unit 201 and displaying or reproducing the information by the information presentment unit 204 in response to a user request.

Heretofore, the embodiment of the present technology has been described. However, the present technology is not limited to the embodiment above and can of course be variously modified without departing from the gist of the present technology.

For example, although the example where the fixed layer is provided below the storage layer in the Z-axis direction in the storage device has been described in the embodiment above, the positions of the storage layer and the fixed layer in the storage device may become opposite. As an example, the storage device may be of a so-called top laminated ferrimagnetic type in which the fixed layer of the laminated ferrimagnetic structure is provided above the storage layer in the Z-axis direction.

It should be noted that the present technology can also take the following configurations.

(1) A storage device, including:

a fixed layer including a first ferromagnetic layer that includes a fixed perpendicular magnetization;

a storage layer including a second ferromagnetic layer that includes a perpendicular magnetization invertible by a spin injection;

an intermediate layer that is formed of an insulator and is arranged between the storage layer and the fixed layer; and a heat generation layer that is formed of a resistance heating element and is arranged in at least one of the storage layer and the fixed layer.

(2) The storage device according to (1), in which the heat generation layer is arranged in at least the storage layer.

(3) The storage device according to (1) or (2), in which the heat generation layer is adjacent to the first ferromagnetic layer or the second ferromagnetic layer.

(4) The storage device according to any one of (1) to (3), in which the resistance heating element is configured by at least one of a nitride, carbide, boride, oxide, elemental carbon, and elemental boron and includes an electrical resistivity of $1\ \Omega m$ or more and $1*10^4\ \Omega m$ or less at 20° C.

(5) The storage device according to any one of (1) to (4), in which the heat generation layer has a thickness of 0.2 nm or more and 2.0 nm or less.

(6) The storage device according to any one of (1) to (5), in which the first ferromagnetic layer and the second ferromagnetic layer are formed of a metal including at least one of Co, Fe, and Ni as a main component or a boron alloy including at least one of Co, Fe, and Ni and B.

(7) The storage device according to (6), in which
the first ferromagnetic layer and the second ferromagnetic layer are formed of a material including at least one of V, Cr, Nb, Mo, Ta, W, Hf, Zr, Ti, and Ru as an accessory component.
(8) The storage device according to (1), in which
the fixed layer further includes two first ferromagnetic layers and a nonmagnetic layer arranged between the two first ferromagnetic layers.
(9) The storage device according to (8), in which at least one of the two first ferromagnetic layers is formed of a material including at least one of Co, Fe, and Ni and at least one of Pt, Pd, Rh, and Ni as main components.
(10) The storage device according to (9), in which one of the two first ferromagnetic layers is formed of a material including at least one of Co, Fe, and Ni and at least one of Pt, Pd, Rh, and Ni as main components, and
the other one of the two first ferromagnetic layers is formed of a metal including at least one of Co, Fe, and Ni as a main component or a boron alloy including at least one of Co, Fe, and Ni and B.
(11) The storage device according to any one of (1) to (10), in which
the insulator is configured by MgO.
(12) The storage device according to any one of (1) to (11), further including
a cap layer adjacent to the storage layer on a side opposite to the intermediate layer.
(13) The storage device according to (12), in which
the cap layer includes a metal layer including any one of Hf, Ta, W, Zr, Nb, Mo, Ti, Mg, V, Cr, Ru, Rh, Pd, and Pt as a main component.
(14) The storage device according to (13), in which the cap layer further includes an oxide layer including any one of MgO, $Al_2O_3$, and $SiO_2$ as a main component.
(15) The storage device according to any one of (1) to (14), further including
a base layer adjacent to the fixed layer on a side opposite to the intermediate layer.
(16) The storage device according to (15), in which
the base layer includes a plurality of layers that include any one of Ta, Ti, Cu, TiN, TaN, NiCr, NiFeCr, Ru, and Pt as a main component.
(17) A storage apparatus, including:
a plurality of storage devices each including
a fixed layer including a first ferromagnetic layer that includes a fixed perpendicular magnetization,
a storage layer including a second ferromagnetic layer that includes a perpendicular magnetization invertible by a spin injection,
an intermediate layer that is formed of an insulator and is arranged between the storage layer and the fixed layer, and
a heat generation layer that is formed of a resistance heating element and is arranged in at least one of the storage layer and the fixed layer; and
a wiring unit configured to be capable of supplying a current to each of the plurality of storage devices.
(18) A magnetic head, including
a magnetic device including
a fixed layer including a first ferromagnetic layer that includes a fixed perpendicular magnetization,
a storage layer including a second ferromagnetic layer that includes a perpendicular magnetization invertible by a spin injection,
an intermediate layer that is formed of an insulator and is arranged between the storage layer and the fixed layer, and
a heat generation layer that is formed of a resistance heating element and is arranged in at least one of the storage layer and the fixed layer.
(19) An electronic apparatus, including:
a storage unit including
a plurality of storage devices each including
a fixed layer including a first ferromagnetic layer that includes a fixed perpendicular magnetization,
a storage layer including a second ferromagnetic layer that includes a perpendicular magnetization invertible by a spin injection,
an intermediate layer that is formed of an insulator and is arranged between the storage layer and the fixed layer, and
a heat generation layer that is formed of a resistance heating element and is arranged in at least one of the storage layer and the fixed layer; and
a control unit configured to be capable of accessing the storage unit.

REFERENCE SIGNS LIST

20 storage apparatus
3 storage layer
31 base layer
32 fixed layer
321 first ferromagnetic layer
33 intermediate layer
34 storage layer
341 second ferromagnetic layer
342 heat generation layer
35 cap layer
M32 perpendicular magnetization
M34 perpendicular magnetization

The invention claimed is:

1. A storage device, comprising:
a fixed layer including a first ferromagnetic layer,
wherein the first ferromagnetic layer includes a fixed perpendicular magnetization;
an intermediate layer of an insulator; and
a storage layer including:
a second ferromagnetic layer, wherein
the second ferromagnetic layer includes a perpendicular magnetization, and
the perpendicular magnetization is invertible by a spin injection process;
and
a heat generation layer of a resistance heating element, wherein
the resistance heating element includes at least one of a nitride, carbide, or elemental carbon,
the heat generation layer comprises a first surface and a second surface,
the second surface is opposite to the first surface,
the first surface of the heat generation layer is in contact with the intermediate layer,
the second surface of the heat generation layer is in contact with at least one of the storage layer or the fixed layer, and
the intermediate layer is between the storage layer and the fixed layer.

2. The storage device according to claim 1, wherein the second surface of the heat generation layer is in contact with at least the storage layer.

3. The storage device according to claim 1, wherein the second surface of the heat generation layer is adjacent to one of the first ferromagnetic layer or the second ferromagnetic layer.

4. The storage device according to claim 1, wherein
an electrical resistivity of the resistance heating element is greater than or equal to 1 Ωm and less than or equal to $1*10^4$ Ωm, at a temperature of 20° C.

5. The storage device according to claim 1, wherein a thickness of the heat generation layer is greater than or equal to 0.2 nm and less than or equal to 2.0 nm.

6. The storage device according to claim 1, wherein
each of the first ferromagnetic layer and the second ferromagnetic layer comprises one of a metal or a boron alloy,
the metal includes at least one of Co, Fe, or Ni as a main component, and
the boron alloy includes at least one of Co, Fe, or Ni and B.

7. The storage device according to claim 6, wherein
each of the first ferromagnetic layer and the second ferromagnetic layer comprises a material, and
the material includes at least one of V, Cr, Nb, Mo, Ta, W, Hf, Zr, Ti, or Ru as an accessory component.

8. The storage device according to claim 1, wherein
the fixed layer further includes two first ferromagnetic layers and a nonmagnetic layer, and
the nonmagnetic layer is between the two first ferromagnetic layers.

9. The storage device according to claim 8, wherein
at least one of the two first ferromagnetic layers comprises a material, and
the material includes at least one of Co, Fe, or Ni and at least one of Pt, Pd, Rh, or Ni as main components.

10. The storage device according to claim 9, wherein
a first layer of the two first ferromagnetic layers comprises the material,
the material includes the at least one of Co, Fe, or Ni and the at least one of Pt, Pd, Rh, or Ni as the main components,
a second layer of the two first ferromagnetic layers comprises a metal or a boron alloy,
the metal includes the at least one of Co, Fe, or Ni as a main component, and
the boron alloy includes at least one of Co, Fe, or Ni and B.

11. The storage device according to claim 1, wherein the insulator includes MgO.

12. The storage device according to claim 1, further comprising a cap layer adjacent to the storage layer, wherein the cap layer is on a side opposite to the intermediate layer.

13. The storage device according to claim 12, wherein
the cap layer includes a metal layer, and
the metal layer includes one of Hf, Ta, W, Zr, Nb, Mo, Ti, Mg, V, Cr, Ru, Rh, Pd, or Pt as a main component.

14. The storage device according to claim 13, wherein
the cap layer further includes an oxide layer, and
the oxide layer includes one of MgO, $Al_2O_3$, or $SiO_2$ as the main component.

15. The storage device according to claim 1, further comprising a base layer adjacent to the fixed layer on a side opposite to the intermediate layer.

16. The storage device according to claim 15, wherein
the base layer includes a plurality of layers, and
the plurality of layers includes one of Ta, Ti, Cu, TiN, TaN, NiCr, NiFeCr, Ru, or Pt as a main component.

17. A magnetic head, comprising:
a magnetic device including:
a fixed layer including a first ferromagnetic layer, wherein the first ferromagnetic layer includes a fixed perpendicular magnetization;
an intermediate layer of an insulator; and
a storage layer including:
a second ferromagnetic layer, wherein
the second ferromagnetic layer includes a perpendicular magnetization, and
the perpendicular magnetization is invertible by a spin injection process;
and
a heat generation layer of a resistance heating element, wherein
the resistance heating element includes at least one of a nitride, carbide, or elemental carbon,
the heat generation layer comprises a first surface and a second surface,
the second surface is opposite to the first surface,
the first surface of the heat generation layer is in contact with the intermediate layer,
the second surface of the heat generation layer is in contact with at least one of the storage layer or the fixed layer, and
the intermediate layer is between the storage layer and the fixed layer.

* * * * *